United States Patent [19]

Kaufman

[11] Patent Number: 4,818,895
[45] Date of Patent: Apr. 4, 1989

[54] DIRECT CURRENT SENSE LEAD

[76] Inventor: Lance R. Kaufman, 131 N. White Oak Way, Mequon, Wis. 53092

[21] Appl. No.: 120,632

[22] Filed: Nov. 13, 1987

[51] Int. Cl.[4] .................... H01L 29/68; H01L 27/22; G01R 29/12; H04R 19/00
[52] U.S. Cl. .................... 307/303.1; 307/482.1; 307/308; 307/314; 357/25; 357/27; 357/70; 357/75; 174/32; 174/36; 361/400; 374/184; 323/359; 320/39
[58] Field of Search ............ 307/303, 482.1, 530, 307/304, 308, 310, 311, 314; 357/25, 27, 65, 70, 75, 85; 323/359; 174/17 R, 17 CT, 32, 35 R, 35 C, 36; 361/386, 387, 395, 400; 363/19; 320/32, 39; 374/178, 183, 184, 185

[56] References Cited

U.S. PATENT DOCUMENTS

| | | | |
|---|---|---|---|
| 3,958,075 | 5/1976 | Kaufman | 174/16 HS |
| 4,156,148 | 5/1979 | Kaufman | 250/551 |
| 4,196,411 | 4/1980 | Kaufman | 338/314 |
| 4,215,235 | 7/1980 | Kaufman | 174/52 PE |
| 4,218,724 | 8/1980 | Kaufman | 361/395 |
| 4,250,481 | 2/1981 | Kaufman | 338/163 |
| 4,266,140 | 5/1981 | Kaufman | 250/551 |
| 4,394,530 | 7/1983 | Kaufman | 174/16 HS |
| 4,449,165 | 5/1984 | Kaufman | 361/386 |
| 4,449,292 | 5/1984 | Kaufman | 29/631 |
| 4,488,202 | 12/1984 | Kaufman | 361/386 |
| 4,498,120 | 2/1985 | Kaufman | 361/386 |
| 4,546,410 | 10/1985 | Kaufman | 361/387 |
| 4,546,411 | 10/1985 | Kaufman | 361/387 |
| 4,554,613 | 11/1985 | Kaufman | 361/386 |
| 4,574,162 | 3/1986 | Kaufman | 174/16 HS |
| 4,577,387 | 3/1986 | Kaufman | 29/458 |
| 4,607,271 | 8/1986 | Popovic et al. | 357/27 |
| 4,630,174 | 12/1986 | Kaufman | 361/388 |
| 4,633,099 | 12/1986 | Tanabe et al. | 307/308 |
| 4,689,648 | 8/1987 | Vinal | 357/27 |
| 4,700,273 | 10/1987 | Kaufman | 361/388 |
| 4,716,448 | 12/1987 | Kelly | 307/308 X |
| 4,733,115 | 3/1988 | Barone et al. | 361/400 X |
| 4,737,672 | 4/1988 | Kazami | 357/27 X |
| 4,739,380 | 4/1988 | Lauks et al. | 357/25 |
| 4,767,973 | 8/1988 | Jacobsen et al. | 307/308 X |

OTHER PUBLICATIONS

"Current Sensing HexSense Power MOSFETs Simplify SMPS Design and Lower Losses", Sean Young, PCIm (Power Conversion and Intelligent Motion Magazine), Jul., 1987, pp. 76–83.

Primary Examiner—Stanley D. Miller
Assistant Examiner—David R. Bertelson
Attorney, Agent, or Firm—Andrus, Sceales, Starke & Sawall

[57] ABSTRACT

In a circuit assembly (36) having a semiconductor chip such as a MOSFET (12) mounted on a drain terminal lead frame (6) on a ceramic substrate (4), a combined source and gate return reference jumper wire (40) is connected between a current sense lead frame (52) and a combined gate return reference and current sense lead frame (38). The jumper wire has a first middle portion (42) connected to the source pad (14) of the MOSFET chip (12), and has a second middle portion 58 connected to the source terminal lead frame (8). Direct gate return referencing is provided, minimizing inductance in the gate return which is otherwise present when the gate return current path shares a portion of the source terminal current path. Direct current sensing is also provided, and the IR drop is sensed across the section of the wire jumper between the noted first and second middle portions (42 and 58), without the need of an auxiliary resistor in series with the source terminal. A gold wire (62) is bonded to an aluminum jumper wire (40) directly at the MOSFET source pad (14) at the noted first middle portion (42) of the wire, to provide a thermocouple thereat for direct junction temperature sensing.

27 Claims, 2 Drawing Sheets

DIRECT CURRENT SENSE LEAD

BACKGROUND AND SUMMARY

The invention relates to electrical circuit assemblies, and more particularly to gate return and current sensing connection and lead structure for such circuitry.

Electrical circuit assemblies typically include an electrically insulating thermally conductive substrate, such as ceramic, having a plurality of electrically conductive lead frames, such as copper, mounted on the substrate, and various semiconductor elements mounted on the lead frames and enclosed by an electrically insulating housing. Examples of such circuit assemblies are shown in U.S. Pat. Nos. 3,958,075, 4,156,148, 4,196,411, 4,215,235, 4,218,724, 4,250,481, 4,266,140, 4,394,530, 4,449,165, 4,449,292, 4,488,202, 4,498,120, 4,546,410, 4,546,411, 4,554,613, 4,574,162, 4,577,387, 4,630,174, 4,700,273. In other circuit assemblies, such as type TO-218, the ceramic substrate is deleted from the bottom of the housing, and the lead frame pads are left exposed when supplied to the user. The user mounts the package to a ceramic or other substrate according to his particular application.

The present invention involves the physical interconnection structure in such circuit assemblies for gate return referencing, and also for current sensing applications. The latter enables current mode control of switched mode power supplies, which has now been recognized as a better approach than voltage controlled methods, as noted in "Current Sensing HexSense Power MOSFETs Simplify SMPS Designs and Lower Losses", Sean Young, PCIM (Power Conversion and Intelligent Motion Magazine), July, 1987, pages 76–83. As noted in the Young article, current mode control has advantages of improved stability, automatic feed forward compensation for input voltage variations, pulse by pulse current limiting, and ease of paralleling supplies. The current mode control approach has become popular due to a variety of integrated circuits available to handle the control functions. A disadvantage to the current mode control has been the lack of an efficient means of monitoring instantaneous values of currents in the switching devices.

As noted in the Young article, in the past the current sensing function was usually done using either a sensing resistor or a current transformer in series with the switching device. The disadvantage of the series resistor is that it must always handle energy-wasting high heat dissipation, and its ohmic value must be chosen as a compromise between keeping such dissipation low, while at the same time generating a large enough signal. The disadvantage of the current transformer approach is that it is a magnetic component prone to saturation.

The Young et al article notes a current sensing power MOSFET component, the HexSense, which provides current sensing with negligible electrical losses. Such components are identical to standard power MOSFETs except that current from a few MOSFET cells are diverted to a separate source pin providing a known ratio of total current. Another pin, known as the Kelvin source, is connected to a point on the main source metallization. This Kelvin connection is the return point for the sense current. The voltage drop across the Kelvin pin is negligible and is unaffected by the magnitude of the main source current. This arrangement avoids errors in current sensing accuracy that would result if a voltage drop existed between the return point and the source metallization.

The present invention provides current sensing without an auxiliary sensing resistor and without a transformer. The invention utilizes standard semiconductor chips, such as standard MOSFETs, without the need for specialized MOSFETs such as the HexSense in the Young article.

The present invention provides lead frame terminal and semiconductor chip pad interconnection bonding structure enabling direct current sensing.

The invention also provides lead frame terminal and semiconductor chip pad interconnection bonding structure enabling direct gate return referencing. The invention minimizes the inductance otherwise present in previous designs using part of the source terminal for the gate reference return. This direct gate return referencing is accomplished without plural laterally adjacent bonds on the source pad with otherwise restrict the size of terminal wires which can fit within a given lateral size of such pad.

The invention also enables direct junction temperature sensing.

In the preferred embodiment, gate reference return inductance is minimized by providing a direct connection at the source pad for the gate reference terminal. Such inductance is also minimized by substantially eliminating the portion of the main source terminal through which both source current and gate return current flow.

Further in the preferred embodiment, a current sense terminal is connected to the source terminal at a point spaced from the source pad of the chip to define a given length of the source terminal therebetween. The gate return terminal directly connected to the source pad additionally serves as a current sense terminal such that the current flow through the source pad and the source terminal may be sensed according to the IR drop across the noted given length of the source terminal, without the need of an auxiliary resistor.

DETAILED DESCRIPTION

Description of Prior Art

Figure 1:
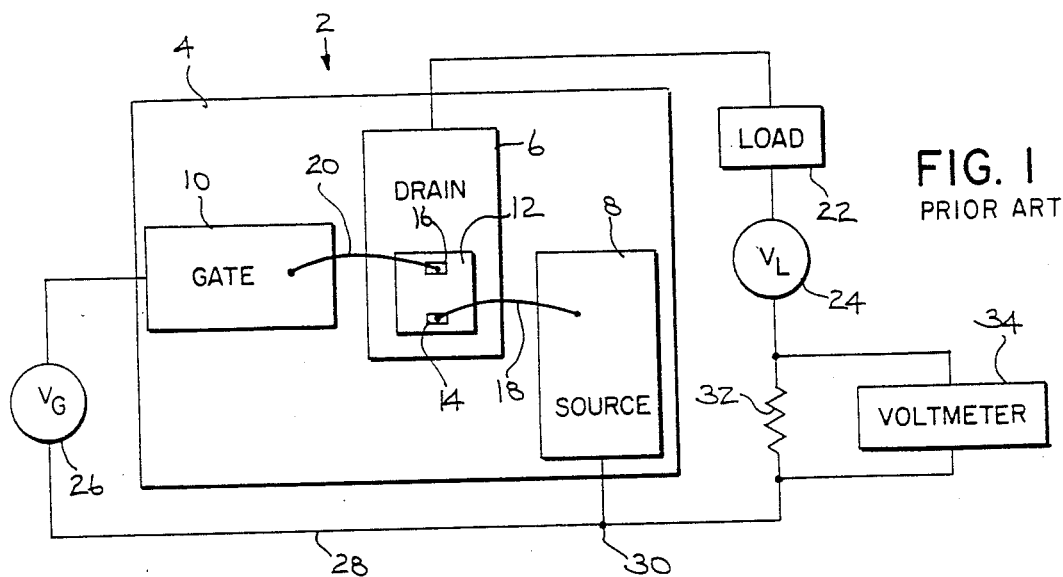
FIG. 1 is a schematic illustration of an electrical circuit assembly known in the prior art.

FIG. 1 shows an electrical circuit assembly 2 including an electrically insulating thermally conductive ceramic substrate 4, and a plurality of electrically conductive copper lead frames 6, 8 and 10 mounted on the substrate. One or more semiconductor chips such as 12 is mounted on the lead frames in various electrical circuit configurations. The structure is covered by an electrically insulating housing (not shown) which clamps substrate 4 to a heat sink (not shown), for example as shown in the above noted circuit assembly patents. A TO-218 circuit assembly is similar, except that the lead frames are mounted to a housing which is supplied from the manufacturer without a ceramic substrate, which housing is later mounted to a ceramic substrate by the user.

In the particular embodiment shown in FIG. 1, chip 12 is a MOSFET having a lower drain terminal connection pad mounted on drain lead frame 6 in electrical contact therewith. MOSFET 12 has a top surface with an upper source terminal connection pad 14 and a gate terminal connection pad 16. The connection pads are typically metallized aluminum. A source terminal jumper conductor wire 18 is connected between source pad 14 and source lead frame 8. A gate terminal jumper conductor wire 20 is connected between gate pad 16 and gate lead frame 10. Lead frames 6 and 8 provide the main terminals for the main current flow path through chip 12 from drain to source and through the external load circuit through load 22 and load voltage source 24. Gate lead frame 10 provides a control terminal for controlling the main current flow. MOSFET 12 is biased into conduction by gate voltage source 26. The gate return reference is provided through connection 28 to source terminal 8 at node 30.

The MOSFET source current flows from source pad 14 through jumper wire 18 through lead frame 8 to node 30 and then to the load voltage source 24. The gate return reference current flows from source pad 14 through jumper wire 18 through lead frame 8 to node 30 and then through conductor 28 back to gate voltage source 26. The current flow path between source pad 14 and node 30 thus contains both main source current and gate return reference current.

For current sensing applications, for example as noted in the above Young article, a resistor 32 is connected in series with the source lead, and a voltmeter 34 senses the IR drop across the resistor.

DESCRIPTION OF THE INVENTION

Figure 2:
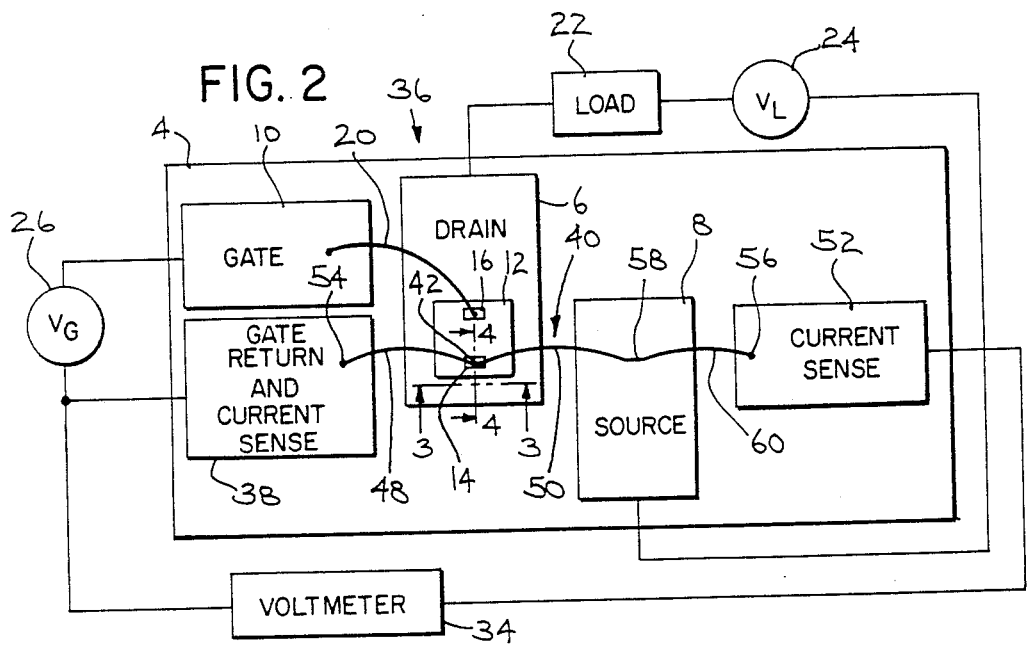
FIG. 2 is a schematic illustration of an electrical circuit assembly in accordance with the invention.
Figure 3:
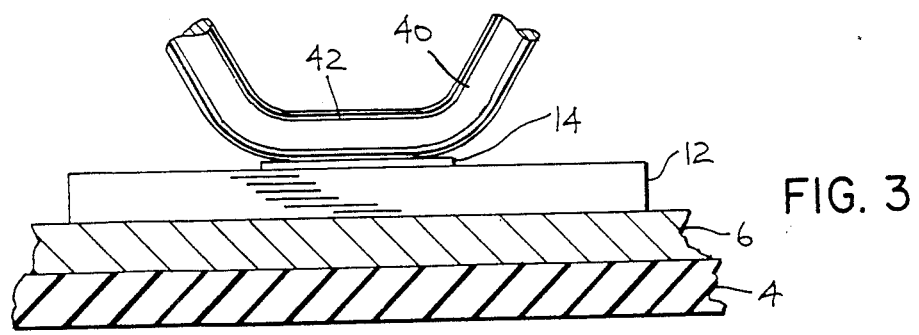
FIG. 3 is an enlarged side view of a portion of the structure of FIG. 2 taken along line 3—3.

FIG. 2 shows an electrical circuit assembly 36 in accordance with the invention, and uses like reference numerals from FIG. 1 where appropriate to facilitate clarity. As in FIG. 1, MOSFET 12 has a bottom drain terminal connection pad of given lateral size, usually the entire lateral size of the chip. MOSFET 12 has an upper source terminal connection pad 14 and a gate terminal connection pad 16 of limited lateral size substantially smaller than the lateral size of the chip. FIG. 2 includes a gate return lead frame 38 mounted on substrate 4.

In the prior art of FIG. 1, the gate return reference terminal 28 is connected through the source terminal, or at least a portion thereof, to source pad 14. Because the gate return reference current flow path shares a common portion with the source current flow path, there is a given amount of inductance in the overall gate return reference terminal. This inductance is significantly higher than that which would be possible with a direct connection of the gate return reference to source pad 14. However, source pad 14 has only a limited lateral size, which restricts the size of terminals or wires which can fit thereon. This limited lateral size also restricts the number of laterally adjacent bonds which can be formed thereon.

The present invention provides structure for minimizing the inductance in the gate control return reference terminal connection to gate voltage source 26. In the present invention, FIG. 2, the gate return reference terminal is connected directly at source pad 14 without plural laterally adjacent bonds at source pad 14 which would otherwise restrict the size of terminals which can fit within the given limited lateral size of source pad 14.

In the preferred embodiment, a combined source terminal jumper conductor and gate return reference terminal jumper conductor is provided by a single continuous conductor wire 40 connected between gate return reference lead frame 38 and source lead frame 8, and has a middle portion 42 connected to source pad 14. Middle portion 42 is the only portion of the continuous jumper wire which carries both gate return reference current to gate voltage source 26 and main source current to load voltage source 24. This middle portion 42 carrying both types of current is laterally confined within the lateral limits of source pad 14. This substantially diminishes to zero the portion of the source terminal through which gate return reference current must flow.

Figure 4:
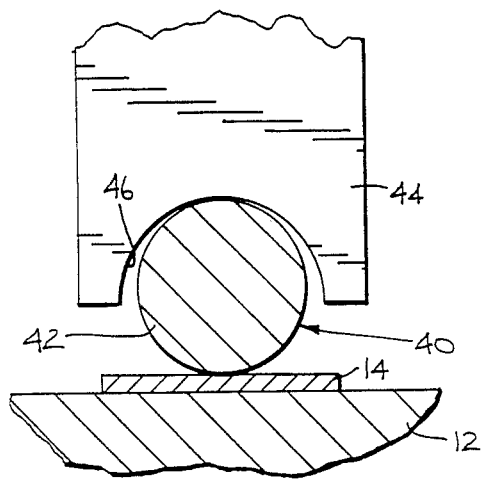
FIG. 4 is an enlarged side view of a portion of the structure of FIG. 2 taken along line 4—4.

Middle jumper wire portion 42 is connected to source pad 14 with a simple stitch bond providing a single weld in a single step. As shown in FIG. 4, a welding fixture 44 having an inverted U-shaped configuration 46 is placed transversely across conductor wire 40 at middle portion 42, and the wire is ultrasonically stitch bonded to source pad 14. Gate return reference terminal section 48 of jumper wire 40 and source terminal section 50 of jumper wire 40 are thus continuous with each other and connected in common to source pad 14. This common connection is the only portion of the source terminal carrying both gate return reference current and source current, whereby to minimize inductance in the gate return reference terminal by minimizing the length thereof which additionally carries source terminal current flow.

Also in accordance with the invention, a current sense terminal lead frame 52 is mounted on substrate 4. Single jumperc conductor wire 40 is continued rightwardly in FIG. 2 to also be connected to current sense lead frame 52. Jumper wire 40 has its left end 54 connected to gate return lead frame 38 by a stitch bond as above described. Wire 40 has it right end 56 connected to current sense lead frame 52 by a stitch bond. Jumper wire 40 has a first middle portion 42, as above noted, stitch bonded to source pad 14. Jumper wire 40 has a second middle portion 58 stitch bonded to source lead frame 8. Section 50 of wire 40 is between middle portions 14 and 58. Source current from source pad 14 through source lead frame 8 to load voltage source 24 is sensed according to the IR drop across section 50 of jumper wire 40, without the need of an auxiliary resistor such as 32 in FIG. 1. The voltage at middle portion 42 of jumper wire 40 is sensed at the left end 54 of the wire at gate return lead frame 38. The voltage at middle portion 58 of jumper wire 40 is sensed at right end 56 of the wire at current sense lead frame 52. Voltmeter 34 is connected between lead frames 38 and 52. The gate return lead frame 38 thus additionally serves as a current sense lead frame.

Current sense lead frame 52 is connected through section 60 of jumper wire 40 to source lead frame 8 at a point 58 spaced from source pad 14 and defining a given length of the source terminal through jumper wire section 50 therebetween. The gate return reference terminal provided by lead frame 38 and wire section 48 additionally serves as a current sense terminal such that current flow through source pad 14 and the source terminal provided by wire section 50 and lead frame B may be sensed according to the IR drop across wire section 50 providing the noted given length of the source terminal, all without the need of an auxiliary resistor. The current sense terminal provided by lead frame 38 and wire section 48 provides direct current sensing at source pad 14.

Figure 5:
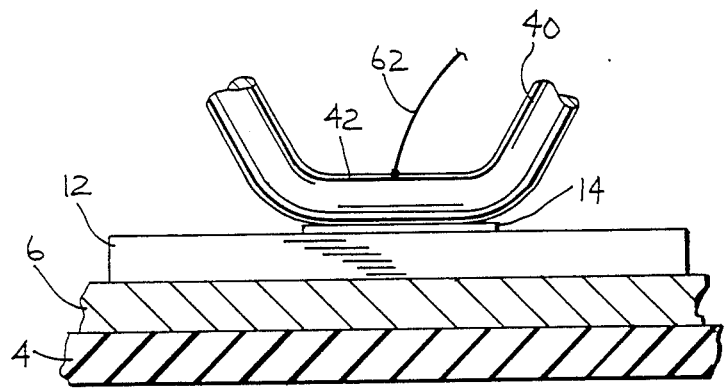
FIG. 5 is a view like FIG. 3 and shows a further embodiment.
Figure 6:
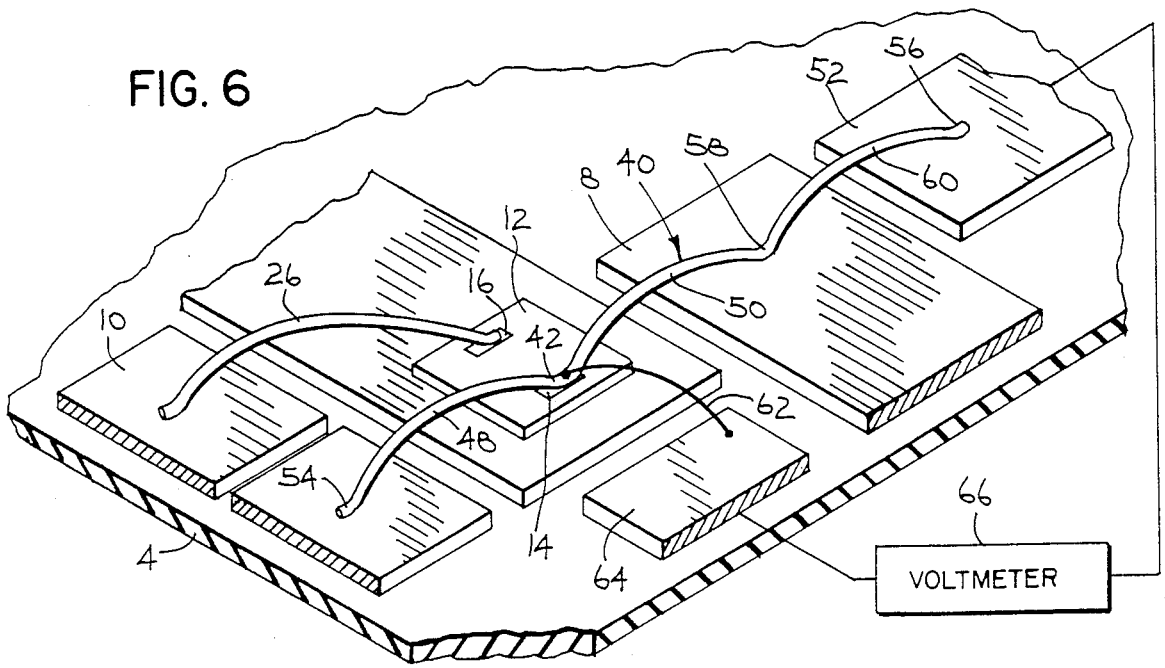
FIG. 6 is a perspective view of a portion of the assembly of FIGS. 2 and 5.

FIGS. 5 and 6 show a further embodiment in accordance with the invention. Single continuous jumper wire 40 is aluminum. A gold wire 62 of substantially smaller diameter then aluminum wire 40 is bonded to wire 40 at portion 42. Alternatively, gold wire 62 is bonded to pad 14, which is aluminum, adjacent portion 42, which adjacency is possible because of the substantially smaller diameter of wire 62. The gold-aluminum interface provides a thermocouple, producing a Seebeck voltage which varies with temperature, as known in the art. The thermocouple provides an accurate indication of MOSFET junction temperature sensed directly at source pad 14. The other end of wire 62 is bonded to a lead frame 64 on substrate 4, and a voltmeter 66 is connected between lead frames 64 and 52 for sensing temperature responsive voltage.

It is recognized that various equivalents, alternatives and modifications are possible within the scope of the appended claims.

I claim:

1. In an electrical circuit assembly comprising a semiconductor chip having first, second and third terminal connection pads of given lateral size, first and second main terminals connected respectively to said first and second connection pads and providing a main current flow path through said chip, a control terminal connected to said third connection pad for controlling said main current flow, a control return reference terminal connected through a portion of said second main terminal to said second connection pad, the improvement comprising means for minimizing inductance in said control return reference terminal comprising means connecting said control return reference terminal to said second main terminal directly at said second connection pad without plural laterally adjacent bonds at said second connection pad otherwise restricting the size of terminals which can fit within said given lateral size of said second connection pad.

2. The invention according to claim 1 wherein said portion of said second main terminal through which said control return reference terminal is connected to said second connection pad does not extend laterally beyond said second connection pad.

3. The invention according to claim 1 comprising a current sense terminal connected to said second main terminal at a point spaced from said second connection pad and defining a given length of said second main terminal therebetween, and wherein said control return reference terminal additionally serves as a current sense terminal such that current flow through said second connection pad and said second main terminal is sensed according to the IR drop across said given length of said second main terminal, without the need of an auxiliary resistor, and such that the second mentioned of said current sense terminals provided by said control return reference terminal provides direct current sensing at said second connection pad.

4. An electrical circuit assembly comprising:
a semiconductor chip having first, second and third terminal connection pads of given lateral size;
first and second main terminals connected respectively to said first and second connection pads and providing a main current flow path through said chip;
a control terminal connected to said third connection pad for controlling said main current flow;
a control return reference terminal connected directly to said second connection pad in common with said second main terminal and providing a return reference for application of control current from said control terminal to said third connection pad, wherein the common connection of said control return reference terminal and said second main terminal is the only portion of said second main terminal carrying both control return reference terminal current and second main terminal current, whereby to minimize inductance in said control return reference terminal by minimizing the length thereof which additionally carries second main terminal current flow.

5. The invention according to claim 4 wherein said common connection is laterally confined within the lateral limits of said second connection pad.

6. An electrical circuit assembly comprising:
a semiconductor chip having first, second and third terminal connection pads;
first, second and third lead frames connected respectively to said first, second and third terminal connection pads, said first and second lead frames providing main terminals for main current flow through said chip, said third lead frame providing a control terminal for controlling said main current flow;
a control return reference terminal lead frame;
a combined second main terminal jumper conductor and control return reference terminal jumper conductor comprising a single continuous conductor connected between said second main terminal lead frame and said control return reference terminal lead frame and having a middle portion connected to said second main terminal connection pad, and wherein said middle portion is the only portion of said continuous conductor carrying both control return reference terminal lead frame current and second main terminal lead frame current, to minimize inductance in said control return reference terminal lead frame.

7. The invention according to claim 6 wherein said chip has a given lateral size, and said second main terminal connection pad has a given lateral size substantially smaller than said chip lateral size, and wherein said only portion of said continuous conductor carrying both control return reference terminal lead frame current and second main terminal lead frame current is laterally confined within the lateral limits of said second main terminal connection pad, to further minimize inductance in said control return reference terminal lead frame.

8. The invention according to claim 6 further comprising a current sense terminal lead frame, and wherein said single continuous conductor is also connected to said current sense terminal lead frame, said single continuous conductor having one end connected to said control return reference terminal lead frame and having its other end connected to said current sense terminal lead frame, said single continuous conductor having a first middle portion connected to said second main terminal connection pad and a second middle portion connected to said second main terminal lead frame between said first middle portion and said other end, such that current flow through said second main terminal connection pad and said second main terminal lead frame is sensed according to the IR drop across the section of said single continuous conductor between said first and second middle portions, without the need of an auxiliary resistor, wherein the voltage at said first middle portion is sensed at said one end of said single continuous conductor at said control return reference terminal lead frame, and wherein the voltage at said second middle portion is sensed at said other end of said single continuous conductor at said current sense terminal lead frame.

9. The invention according to said 6 wherein said middle portion of said single continuous conductor is bonded to said second main terminal connection pad by a single weld in a single step, to connect said combined second main terminal jumper conductor and control return reference terminal jumper conductor to said second main terminal connection pad in said single step.

10. The invention according to claim 9 wherein said single step comprises applying a welding fixture with an inverted U-shaped configuration transversely across said single continuous conductor and welding said middle portion to said second main terminal connection pad.

11. The invention according to claim 10 wherein said conductor is ultrasonically stitch bonded to said second main terminal connection pad.

12. An electrical circuit assembly comprising:
a semiconductor chip having first and second main terminal connection pads;
first and second main terminal lead frames connected respectively to said first and second connection pads, said second main terminal lead frame being connected to said second connection pad through a jumper conductor;
current sensing means comprising means connected to said jumper conductor directly at said second main terminal connection pad and connected to said jumper conductor at a point spaced from said second main terminal connection pad by a given length of said jumper conductor therebetween, such that main current flow through said chip and said second main terminal connection pad is sensed according to the IR drop across said given length of said jumper conductor, without the need of an auxiliary resistor.

13. The invention according to claim 12 wherein said last mentioned point of connection of said current sensing means to said jumper conductor is directly at said second main terminal lead frame.

14. The invention according to claim 13 further comprising first and second current sense lead frames connected by conductor jumper means respectively to said second main terminal connection pad and to said second main terminal lead frame.

15. The invention according to claim 14 comprising a single continuous conductor having one end connected to said first current sense lead frame and having its other end connected to said second current sense lead frame, said single continuous conductor having a first middle portion connected to said second main terminal connection pad and a second middle portion connected to said second main terminal lead frame between said first middle portion and said other end, such that current through said second main terminal connection pad flows through the section of said single continuous conductor between said first and second middle portions and also flows through said second main terminal lead frame, and such that said current flow through said second main terminal connection pad is sensed according to the IR drop across said section of said single continuous conductor between said first and second middle portions, wherein the voltage at said first middle portion is sensed at said one end of said single continuous conductor at said first current sense lead frame, and wherein the voltage at said second middle portion is sensed at said other end of said single continuous conductor at said second current sense lead frame.

16. An electrical circuit assembly comprising:
a semiconductor chip having first and second metallized terminal connection pads;
first and second metal terminals connected respectively to said first and second connection pads and providing a current flow path through said chip;
a metal conductor of a different metal material than said second connection pad and bonded to said second connection pad to provide a thermocouple producing a Seebeck voltage which varies with temperature, to provide an accurate indication of temperature sensed directly at said second connection pad.

17. The invention according to claim 16 wherein said metalization of said second connection pad is aluminum, and wherein said last mentioned conductor is a gold wire.

18. An electrical circuit assembly comprising:
a semiconductor chip having first and second terminal connection pads;
first and second metal terminals connected respectively to said first and second connection pads and providing a current flow path through said chip;
a metal conductor of different metal material than said second metal terminal and bonded thereto to provide a thermocouple producing a Seebeck voltage which varies with temperature.

19. The invention according to claim 18 wherein said last mentioned metal conductor is bonded to said second metal terminal directly at said second connection pad to provide an accurate indication of temperature sensed directly at said second connection pad.

20. The invention according to claim 18 wherein said second metal terminal is aluminum, and said last mentioned conductor is gold.

21. The invention according to claim 20 wherein said gold conductor is a small gold wire of substantially smaller diameter than said aluminum terminal.

22. An electrical circuit assembly comprising:
a semiconductor chip having first, second and third metallized aluminum terminal connection pads;
first, second and third lead frames connected respectively to said first, second and third terminal connection pads, said first and second lead frames providing first and second main terminals providing a main current flow path through said chip, said third lead frame providing a control terminal for controlling said main current flow;
a control return reference terminal lead frame;
a combined second main terminal jumper conductor and control return reference terminal jumper conductor comprising conductor means connected between said second main terminal lead frame and said control return reference terminal lead frame and bonded to said second main terminal connection pad;
a gold wire of smaller diameter than said last mentioned conductor means and bonded to said second main terminal aluminum connection pad to provide a thermocouple producing a Seebeck voltage which varies with temperature, to provide an accurate indication of junction temperature sensed directly at said second main terminal connection pad.

23. An electrical circuit assembly comprising:
a semiconductor chip having first, second and third terminal connection pads;
first, second and third lead frames connected respectively to said first, second and third terminal connection pads said first and second lead frames providing first and second main terminals for main current flow through said chip, said third lead frame providing a control terminal for controlling said main current flow;
a control return reference terminal lead frame;
a combined second main terminal jumper conductor and control return reference terminal jumper conductor comprising a single continuous aluminum conductor connected between said second main terminal lead frame and said control return reference terminal lead frame and having a middle portion bonded to said second main terminal connection pad;
a gold wire of smaller diameter than said aluminum conductor and bonded to said aluminum conductor at said middle portion to provide a thermocouple producing a Seebeck voltage which varies with temperature, to provide an accurate indication of junction temperature sensed directly at said second main terminal connection pad.

24. The invention according to claim 23 further comprising in combination a current sense terminal lead frame, and wherein said single continuous aluminum conductor is also connected to said current sense terminal lead frame, said single continuous aluminum conductor having one end connected to said control return reference terminal lead frame and having its other end connected to said current sense terminal lead frame, said single continuous aluminum conductor having a first middle portion connected to said second main terminal connection pad and a second middle portion connected to said second main terminal lead frame between said first middle portion and said other end, such that current flow through said second main terminal connection pad and said second main terminal lead frame is sensed according to the IR drop across the section of said single continuous aluminum conductor between said first and second middle portions, without the need of an auxiliary resistor, wherein the voltage at said first middle portion is sensed at one end of said single continuous aluminum conductor at said control return reference terminal lead frame, and wherein the voltage at said second middle portion is sensed at said other end of said single continuous aluminum conductor at said current sense terminal lead frame.

25. An electrical circuit assembly comprising:
a semiconductor chip having first, second and third terminal connection pads;
first, second, third, fourth, fifth and sixth lead frames, said first and second leadframes connected respectively to said first and second terminal connection pads and providing main terminals for main current flow through said chip, said third lead frame being connected to said third terminal connection pad and providing a control terminal for controlling said main current flow;
a main current flow jumper section connected between said second main terminal connection pad and said second lead frame;
a fourth lead frame jumper section connected between said fourth lead frame and said main current flow jumper section at said second lead frame;
a fifth lead frame jumper section connected between said fifth lead frame and said second main terminal connection pad;
a sixth lead frame jumper section connected between said sixth lead frame and said second main terminal connection pad.

26. The invention according to claim 25 wherein said main current flow jumper section and fourth lead frame jumper section and said fifth lead frame jumper section comprise a single continuous conductor having one end connected to said fourth lead frame and having its other end connected to said fifth lead frame, and having a first middle portion connected to said second main terminal connection pad and a second middle portion connected to said second lead frame.

27. The invention according to claim 26 wherein said sixth lead frame jumper section is bonded on top of said first middle portion of said continuous conductor to provide said connection of said sixth lead frame section to said second main terminal connection pad.

* * * * *